(12) United States Patent
Das et al.

(10) Patent No.: US 10,921,159 B1
(45) Date of Patent: Feb. 16, 2021

(54) USE OF REFERENCE SENSOR IN RESONANT PHASE SENSING SYSTEM

(71) Applicant: Cirrus Logic International Semiconductor Ltd., Edinburgh (GB)

(72) Inventors: Tejasvi Das, Austin, TX (US); Zhong You, Austin, TX (US); Siddharth Maru, Austin, TX (US); Eric J. King, Austin, TX (US); Johann G. Gaboriau, Austin, TX (US); Luke Lapointe, Austin, TX (US); Matthew Beardsworth, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 62 days.

(21) Appl. No.: 16/299,565

(22) Filed: Mar. 12, 2019

Related U.S. Application Data (60) Provisional application No. 62/649,857, filed on Mar. 29, 2018, provisional application No. 62/721,134, (Continued)

(51) Int. Cl.
　　*G01R 27/26* (2006.01)
　　*G01D 5/243* (2006.01)
　　*G01R 27/28* (2006.01)

(52) U.S. Cl.
　　CPC ......... *G01D 5/243* (2013.01); *G01R 27/2605* (2013.01); *G01R 27/2611* (2013.01); *G01R 27/28* (2013.01)

(58) Field of Classification Search
　　CPC ........ G01D 5/243; G01D 5/202; G01D 5/204; G01D 5/2026; G01D 5/2006;
(Continued)

(56) References Cited

U.S. PATENT DOCUMENTS 4,888,554 A　12/1989　Hyde et al.
5,286,941 A　2/1994　Bel
(Continued)

FOREIGN PATENT DOCUMENTS

DE　　　1004450 A1　8/1991
DE　102015215330 A1　2/2017
(Continued)

OTHER PUBLICATIONS

International Search Report and Written Opinion of the International Searching Authority, International Application No. PCT/US2019/022518, dated May 24, 2019.
(Continued)

*Primary Examiner* — Thang X Le
(74) *Attorney, Agent, or Firm* — Jackson Walker L.L.P.

(57) ABSTRACT

A system may include a first resistive-inductive-capacitive sensor, a second resistive-inductive-capacitive sensor, and a measurement circuit communicatively coupled to the first resistive-inductive-capacitive sensor and the second resistive-inductive-capacitive sensor and configured to measure first phase information associated with the first resistive-inductive-capacitive sensor, measure second phase information associated with the second resistive-inductive-capacitive sensor, and based on the first phase information and the second phase information, determine a displacement of a mechanical member relative to the first resistive-inductive-capacitive sensor.

54 Claims, 6 Drawing Sheets

Related U.S. Application Data filed on Aug. 22, 2018, provisional application No. 62/739,970, filed on Oct. 2, 2018, provisional application No. 62/740,029, filed on Oct. 2, 2018.

(58) Field of Classification Search
CPC ............... G01R 27/2611; G01R 27/28; G01R 27/2605; G01B 7/003; G01B 7/023
See application file for complete search history.

(56) References Cited

U.S. PATENT DOCUMENTS

| | | | |
|---|---|---|---|
| 5,380,923 | A | 1/1995 | Wright et al. |
| 5,898,136 | A | 4/1999 | Katsurahira |
| 6,231,520 | B1 | 5/2001 | Maezawa |
| 8,384,378 | B2 | 2/2013 | Feldkamp et al. |
| 8,421,446 | B2* | 4/2013 | Straubinger .......... G01D 5/2225 324/207.15 |
| 9,707,502 | B1 | 7/2017 | Bonifas et al. |
| 10,642,435 | B2 | 5/2020 | Maru et al. |
| 10,725,549 | B2 | 7/2020 | Marijanovic et al. |
| 2003/0038624 | A1 | 2/2003 | Hilliard et al. |
| 2005/0192727 | A1 | 9/2005 | Shostak et al. |
| 2005/0258826 | A1* | 11/2005 | Kano ...................... G01D 5/243 324/207.26 |
| 2006/0025897 | A1 | 2/2006 | Shostak et al. |
| 2007/0198926 | A1 | 8/2007 | Joguet et al. |
| 2008/0150905 | A1 | 6/2008 | Grivna et al. |
| 2008/0312857 | A1 | 12/2008 | Seguine |
| 2009/0009195 | A1 | 1/2009 | Seguine |
| 2009/0058430 | A1 | 3/2009 | Zhu |
| 2009/0140728 | A1 | 6/2009 | Rollins et al. |
| 2009/0278685 | A1 | 11/2009 | Potyrailo et al. |
| 2010/0045360 | A1 | 2/2010 | Howard et al. |
| 2010/0153845 | A1 | 6/2010 | Gregorio et al. |
| 2010/0211902 | A1 | 8/2010 | Unsworth et al. |
| 2010/0231239 | A1 | 9/2010 | Tateishi et al. |
| 2010/0238121 | A1 | 9/2010 | Ely |
| 2010/0328249 | A1 | 12/2010 | Ningrat et al. |
| 2011/0005090 | A1 | 1/2011 | Lee et al. |
| 2011/0216311 | A1 | 9/2011 | Kachanov et al. |
| 2011/0267302 | A1 | 11/2011 | Fasshauer |
| 2011/0291821 | A1 | 12/2011 | Chung |
| 2011/0301876 | A1 | 12/2011 | Yamashita |
| 2013/0018489 | A1 | 1/2013 | Grunthaner et al. |
| 2013/0076374 | A1 | 3/2013 | Huang |
| 2013/0106756 | A1 | 5/2013 | Kono et al. |
| 2013/0106769 | A1 | 5/2013 | Bakken et al. |
| 2013/0269446 | A1* | 10/2013 | Fukushima .......... G01B 5/0004 73/818 |
| 2014/0028327 | A1 | 1/2014 | Potyrailo et al. |
| 2014/0225599 | A1 | 8/2014 | Hess |
| 2014/0267065 | A1 | 9/2014 | Levesque |
| 2015/0022174 | A1 | 1/2015 | Nikitin |
| 2015/0077094 | A1 | 3/2015 | Baldwin et al. |
| 2015/0329199 | A1 | 11/2015 | Golbome et al. |
| 2016/0018940 | A1 | 1/2016 | Lo et al. |
| 2016/0048256 | A1 | 2/2016 | Day |
| 2016/0179243 | A1 | 6/2016 | Schwartz |
| 2016/0252403 | A1 | 9/2016 | Murakami |
| 2016/0305997 | A1 | 10/2016 | Wiesbauer et al. |
| 2017/0023429 | A1 | 1/2017 | Straeussnigg et al. |
| 2017/0077735 | A1 | 3/2017 | Leabman |
| 2017/0093222 | A1* | 3/2017 | Joye ...................... H04B 5/0075 |
| 2017/0147068 | A1 | 5/2017 | Yamazaki et al. |
| 2017/0168578 | A1 | 6/2017 | Tsukamoto et al. |
| 2017/0185173 | A1* | 6/2017 | Ito ........................ G06F 3/03545 |
| 2017/0187541 | A1 | 6/2017 | Sundaresan et al. |
| 2017/0237293 | A1 | 8/2017 | Faraone et al. |
| 2017/0328740 | A1* | 11/2017 | Widmer .................. B60L 53/65 |
| 2017/0371380 | A1 | 12/2017 | Oberhauser et al. |
| 2017/0371381 | A1 | 12/2017 | Liu |
| 2017/0371473 | A1 | 12/2017 | David et al. |
| 2018/0019722 | A1 | 1/2018 | Birkbeck |
| 2018/0055448 | A1 | 3/2018 | Karakaya et al. |
| 2018/0088064 | A1 | 3/2018 | Potyrailo et al. |
| 2018/0135409 | A1 | 5/2018 | Wilson et al. |
| 2018/0182212 | A1 | 6/2018 | Li et al. |
| 2018/0183372 | A1 | 6/2018 | Li et al. |
| 2018/0195881 | A1 | 7/2018 | Acker |
| 2018/0221796 | A1 | 8/2018 | Bonifas et al. |
| 2018/0229161 | A1 | 8/2018 | Maki et al. |
| 2018/0231485 | A1 | 8/2018 | Potyrailo et al. |
| 2018/0260049 | A1 | 9/2018 | O'Lionaird et al. |
| 2018/0260050 | A1 | 9/2018 | Unseld et al. |
| 2018/0321748 | A1 | 11/2018 | Rao et al. |
| 2019/0179146 | A1 | 6/2019 | De Nardi |
| 2019/0235629 | A1 | 8/2019 | Hu et al. |
| 2019/0302161 | A1 | 10/2019 | You et al. |
| 2019/0302193 | A1 | 10/2019 | Maru et al. |
| 2019/0302890 | A1 | 10/2019 | Marijanovic et al. |
| 2019/0302922 | A1 | 10/2019 | Das et al. |
| 2019/0302923 | A1 | 10/2019 | Maru |
| 2020/0064160 | A1 | 2/2020 | Maru |
| 2020/0133455 | A1 | 4/2020 | Sepehr et al. |
| 2020/0177290 | A1 | 6/2020 | Reimer et al. |
| 2020/0191761 | A1 | 6/2020 | Potyrailo et al. |
| 2020/0271477 | A1 | 8/2020 | Kost et al. |
| 2020/0271706 | A1 | 8/2020 | Wardlaw et al. |
| 2020/0271745 | A1 | 8/2020 | Das et al. |
| 2020/0272301 | A1 | 8/2020 | Duewer et al. |
| 2020/0319237 | A1 | 10/2020 | Maru et al. |

FOREIGN PATENT DOCUMENTS

| | | |
|---|---|---|
| DE | 102015215331 A1 | 2/2017 |
| EP | 1697710 B1 | 4/2007 |
| EP | 2682843 A1 | 1/2014 |
| GB | 2573644 A | 11/2019 |
| JP | 2006246289 A | 9/2006 |
| WO | 00/33244 A2 | 6/2000 |
| WO | 2007068283 A1 | 6/2007 |
| WO | 2016032704 A1 | 3/2016 |

OTHER PUBLICATIONS

International Search Report and Written Opinion of the International Searching Authority, International Application No. PCT/US2019/022578, dated May 27, 2019.
International Search Report and Written Opinion of the International Searching Authority, International Application No. PCT/US2019/021838, dated May 27, 2019.
International Search Report and Written Opinion of the International Searching Authority, International Application No. PCT/US2019/045554, dated Oct. 17, 2019.
Combined Search and Examination Report, UKIPO, Application No. GB1904250.6, dated Sep. 10, 2019.
Combined Search and Examination Report under Sections 17 and 18(3), UKIPO, Application No. GB2001341.3, dated Jun. 29, 2020.

* cited by examiner

USE OF REFERENCE SENSOR IN RESONANT PHASE SENSING SYSTEM

RELATED APPLICATION

The present disclosure claims priority to U.S. Provisional Patent Application Ser. No. 62/739,970, filed Oct. 2, 2018, U.S. Provisional Patent Application Ser. No. 62/649,857, filed Mar. 29, 2018, U.S. Provisional Patent Application Ser. No. 62/721,134, filed Aug. 22, 2018, and U.S. Provisional Patent Application Ser. No. 62/740,029, filed Oct. 2, 2018, all of which are incorporated by reference herein in their entireties.

FIELD OF DISCLOSURE

The present disclosure relates in general to electronic devices with user interfaces, (e.g., mobile devices, game controllers, instrument panels, etc.), and more particularly, resonant phase sensing of resistive-inductive-capacitive sensors for use in a system for mechanical button replacement in a mobile device, and/or other suitable applications.

BACKGROUND

Many traditional mobile devices (e.g., mobile phones, personal digital assistants, video game controllers, etc.) include mechanical buttons to allow for interaction between a user of a mobile device and the mobile device itself. However, because such mechanical buttons are susceptible to aging, wear, and tear that may reduce the useful life of a mobile device and/or may require significant repair if malfunction occurs, mobile device manufacturers are increasingly looking to equip mobile devices with virtual buttons that act as a human-machine interface allowing for interaction between a user of a mobile device and the mobile device itself. Ideally, for best user experience, such virtual buttons should look and feel to a user as if a mechanical button were present instead of a virtual button.

Presently, linear resonant actuators (LRAs) and other vibrational actuators (e.g., rotational actuators, vibrating motors, etc.) are increasingly being used in mobile devices to generate vibrational feedback in response to user interaction with human-machine interfaces of such devices. Typically, a sensor (traditionally a force or pressure sensor) detects user interaction with the device (e.g., a finger press on a virtual button of the device) and in response thereto, the linear resonant actuator may vibrate to provide feedback to the user. For example, a linear resonant actuator may vibrate in response to user interaction with the human-machine interface to mimic to the user the feel of a mechanical button click.

However, there is a need in the industry for sensors to detect user interaction with a human-machine interface, wherein such sensors provide acceptable levels of sensor sensitivity, power consumption, and size.

SUMMARY

In accordance with the teachings of the present disclosure, the disadvantages and problems associated with sensing of human-machine interface interactions in a mobile device may be reduced or eliminated.

In accordance with embodiments of the present disclosure, a system may include a first resistive-inductive-capacitive sensor, a second resistive-inductive-capacitive sensor, a measurement circuit communicatively coupled to the first resistive-inductive-capacitive sensor and the second resistive-inductive-capacitive sensor and configured to measure first phase information associated with the first resistive-inductive-capacitive sensor, measure second phase information associated with the second resistive-inductive-capacitive sensor, and based on the first phase information and the second phase information, determine a displacement of a mechanical member relative to the first resistive-inductive-capacitive sensor.

In accordance with embodiments of the present disclosure, a method may include measuring first phase information associated with a first resistive-inductive-capacitive sensor, measuring second phase information associated with a second resistive-inductive-capacitive sensor, and based on the first phase information and the second phase information, determining a displacement of a mechanical member relative to the first resistive-inductive-capacitive sensor.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 3 illustrates selected components of an inductive sensing system that may be implemented by a resonant phase sensing system, in accordance with embodiments of the present disclosure;

Each of FIGS. 4A-4C illustrates a diagram of selected components of an example resonant phase sensing system, in accordance with embodiments of the present disclosure;

DETAILED DESCRIPTION

Figure 1:
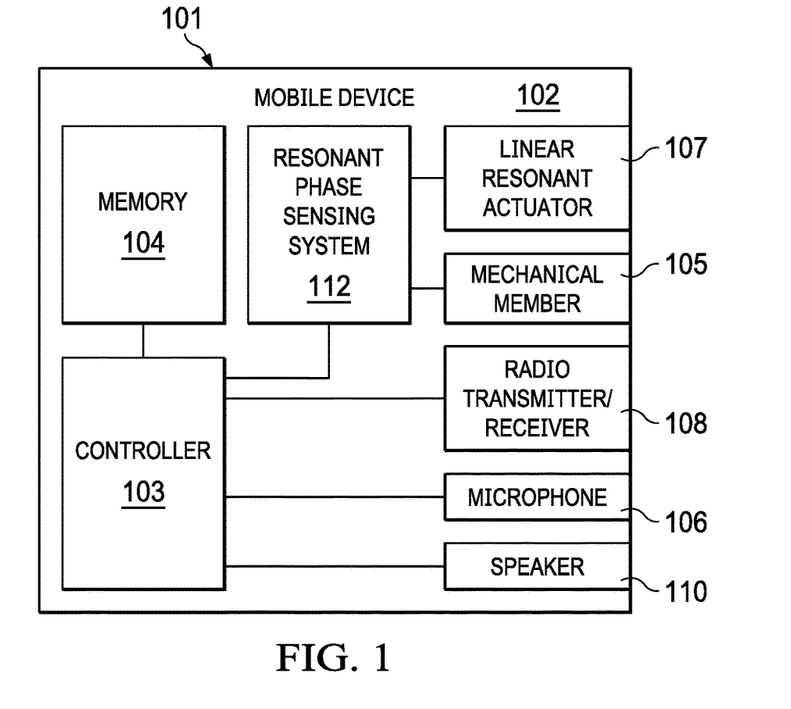
FIG. 1 illustrates a block diagram of selected components of an example mobile device, in accordance with embodiments of the present disclosure.

FIG. 1 illustrates a block diagram of selected components of an example mobile device 102, in accordance with embodiments of the present disclosure. As shown in FIG. 1, mobile device 102 may comprise an enclosure 101, a controller 103, a memory 104, a mechanical member 105, a microphone 106, a linear resonant actuator 107, a radio transmitter/receiver 108, a speaker 110, and a resonant phase sensing system 112.

Enclosure 101 may comprise any suitable housing, casing, or other enclosure for housing the various components of mobile device 102. Enclosure 101 may be constructed from plastic, metal, and/or any other suitable materials. In addition, enclosure 101 may be adapted (e.g., sized and shaped) such that mobile device 102 is readily transported on a person of a user of mobile device 102. Accordingly, mobile device 102 may include but is not limited to a smart phone, a tablet computing device, a handheld computing device, a personal digital assistant, a notebook computer, a video game controller, or any other device that may be readily transported on a person of a user of mobile device 102.

Controller 103 may be housed within enclosure 101 and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, controller 103 may interpret and/or execute program instructions and/or process data stored in memory 104 and/or other computer-readable media accessible to controller 103.

Memory 104 may be housed within enclosure 101, may be communicatively coupled to controller 103, and may include any system, device, or apparatus configured to retain program instructions and/or data for a period of time (e.g., computer-readable media). Memory 104 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to mobile device 102 is turned off.

Microphone 106 may be housed at least partially within enclosure 101, may be communicatively coupled to controller 103, and may comprise any system, device, or apparatus configured to convert sound incident at microphone 106 to an electrical signal that may be processed by controller 103, wherein such sound is converted to an electrical signal using a diaphragm or membrane having an electrical capacitance that varies based on sonic vibrations received at the diaphragm or membrane. Microphone 106 may include an electrostatic microphone, a condenser microphone, an electret microphone, a microelectromechanical systems (MEMs) microphone, or any other suitable capacitive microphone.

Radio transmitter/receiver 108 may be housed within enclosure 101, may be communicatively coupled to controller 103, and may include any system, device, or apparatus configured to, with the aid of an antenna, generate and transmit radio-frequency signals as well as receive radio-frequency signals and convert the information carried by such received signals into a form usable by controller 103. Radio transmitter/receiver 108 may be configured to transmit and/or receive various types of radio-frequency signals, including without limitation, cellular communications (e.g., 2G, 3G, 4G, LTE, etc.), short-range wireless communications (e.g., BLUETOOTH), commercial radio signals, television signals, satellite radio signals (e.g., GPS), Wireless Fidelity, etc.

A speaker 110 may be housed at least partially within enclosure 101 or may be external to enclosure 101, may be communicatively coupled to controller 103, and may comprise any system, device, or apparatus configured to produce sound in response to electrical audio signal input. In some embodiments, a speaker may comprise a dynamic loudspeaker, which employs a lightweight diaphragm mechanically coupled to a rigid frame via a flexible suspension that constrains a voice coil to move axially through a cylindrical magnetic gap. When an electrical signal is applied to the voice coil, a magnetic field is created by the electric current in the voice coil, making it a variable electromagnet. The voice coil and the driver's magnetic system interact, generating a mechanical force that causes the voice coil (and thus, the attached cone) to move back and forth, thereby reproducing sound under the control of the applied electrical signal coming from the amplifier.

Mechanical member 105 may be housed within or upon enclosure 101, and may include any suitable system, device, or apparatus configured such that all or a portion of mechanical member 105 displaces in position responsive to a force, a pressure, or a touch applied upon or proximately to mechanical member 105. In some embodiments, mechanical member 105 may be designed to appear as a mechanical button on the exterior of enclosure 101.

Linear resonant actuator 107 may be housed within enclosure 101, and may include any suitable system, device, or apparatus for producing an oscillating mechanical force across a single axis. For example, in some embodiments, linear resonant actuator 107 may rely on an alternating current voltage to drive a voice coil pressed against a moving mass connected to a spring. When the voice coil is driven at the resonant frequency of the spring, linear resonant actuator 107 may vibrate with a perceptible force. Thus, linear resonant actuator 107 may be useful in haptic applications within a specific frequency range. While, for the purposes of clarity and exposition, this disclosure is described in relation to the use of linear resonant actuator 107, it is understood that any other type or types of vibrational actuators (e.g., eccentric rotating mass actuators) may be used in lieu of or in addition to linear resonant actuator 107. In addition, it is also understood that actuators arranged to produce an oscillating mechanical force across multiple axes may be used in lieu of or in addition to linear resonant actuator 107. As described elsewhere in this disclosure, a linear resonant actuator 107, based on a signal received from resonant phase sensing system 112, may render haptic feedback to a user of mobile device 102 for at least one of mechanical button replacement and capacitive sensor feedback.

Together, mechanical member 105 and linear resonant actuator 107 may form a human-interface device, such as a virtual button, which, to a user of mobile device 102, has a look and feel of a mechanical button of mobile device 102.

Resonant phase sensing system 112 may be housed within enclosure 101, may be communicatively coupled to mechanical member 105 and linear resonant actuator 107, and may include any system, device, or apparatus configured to detect a displacement of mechanical member 105 indicative of a physical interaction (e.g., by a user of mobile device 102) with the human-machine interface of mobile device 102 (e.g., a force applied by a human finger to a virtual button of mobile device 102). As described in greater detail below, resonant phase sensing system 112 may detect displacement of mechanical member 105 by performing resonant phase sensing of a resistive-inductive-capacitive sensor for which an impedance (e.g., inductance, capacitance, and/ or resistance) of the resistive-inductive-capacitive sensor changes in response to displacement of mechanical member 105. Thus, mechanical member 105 may comprise any suitable system, device, or apparatus which all or a portion thereof may displace, and such displacement may cause a change in an impedance of a resistive-inductive-capacitive sensor integral to resonant phase sense system 112. Resonant phase sensing system 112 may also generate an electronic signal for driving linear resonant actuator 107 in response to a physical interaction associated with a human-machine interface associated with mechanical member 105. Detail of an example resonant phase sensing system 112 in accordance with embodiments of the present disclosure is depicted in greater detail below.

Although specific example components are depicted above in FIG. 1 as being integral to mobile device 102 (e.g., controller 103, memory 104, mechanical member 105, microphone 106, radio transmitter/receiver 108, speakers(s) 110, linear resonant actuator 107, etc.), a mobile device 102 in accordance with this disclosure may comprise one or more components not specifically enumerated above. For example, although FIG. 1 depicts certain user interface components, mobile device 102 may include one or more other user interface components in addition to those depicted in FIG. 1, including but not limited to a keypad, a touch screen, and a display, thus allowing a user to interact with and/or otherwise manipulate mobile device 102 and its associated components. In addition, although FIG. 1 depicts only a single virtual button comprising mechanical member 105 and linear resonant actuator 107 for purposes of clarity and exposition, in some embodiments a mobile device 102 may have multiple virtual buttons each comprising a respective mechanical member 105 and linear resonant actuator 107.

Although, as stated above, resonant phase sensing system 112 may detect displacement of mechanical member 105 by performing resonant phase sensing of a resistive-inductive-capacitive sensor for which an impedance (e.g., inductance, capacitance, and/or resistance) of the resistive-inductive-capacitive sensor changes in response to displacement of mechanical member 105, in some embodiments resonant phase sensing system 112 may primarily detect displacement of mechanical member 105 by using resonant phase sensing to determine a change in an inductance of a resistive-inductive-capacitive sensor. For example, FIGS. 2 and 3 illustrate selected components of an example inductive sensing application that may be implemented by resonant phase sensing system 112, in accordance with embodiments of the present disclosure.

Figure 2:
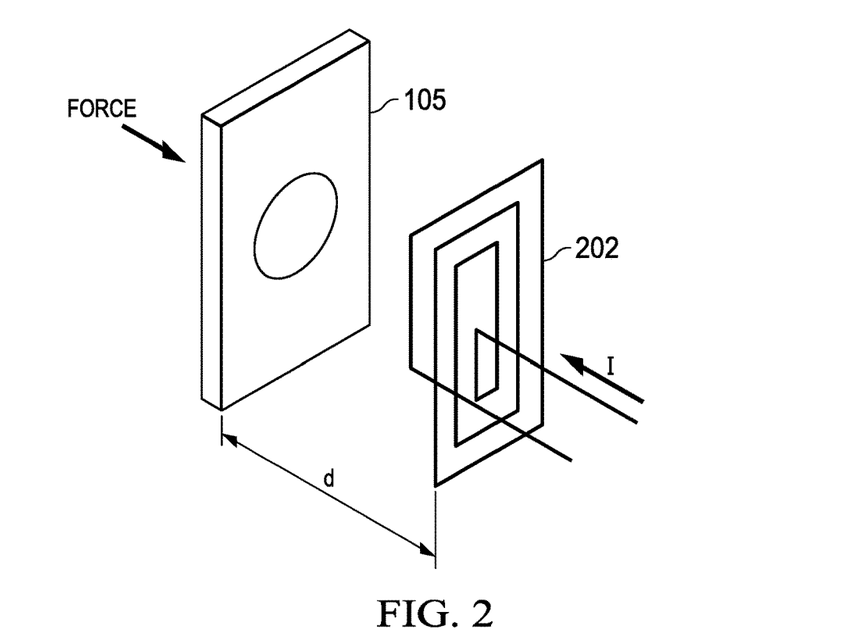
FIG. 2 illustrates a mechanical member separated by a distance from an inductive coil, in accordance with embodiments of the present disclosure.

FIG. 2 illustrates mechanical member 105 embodied as a metal plate separated by a distance d from an inductive coil 202, in accordance with embodiments of the present disclosure. FIG. 3 illustrates selected components of an inductive sensing system 300 that may be implemented by resonant phase sensing system 112, in accordance with embodiments of the present disclosure. As shown in FIG. 3, inductive sensing system 300 may include mechanical member 105, modeled as a variable electrical resistance 304 and a variable electrical inductance 306, and may include inductive coil 202 in physical proximity to mechanical member 105 such that inductive coil 202 has a mutual inductance with mechanical member 105 defined by a variable coupling coefficient k. As shown in FIG. 3, inductive coil 202 may be modeled as a variable electrical inductance 308 and a variable electrical resistance 310.

In operation, as a current I flows through inductive coil 202, such current may induce a magnetic field which in turn may induce an eddy current inside mechanical member 105. When a force is applied to and/or removed from mechanical member 105, which alters distance d between mechanical member 105 and inductive coil 202, the coupling coefficient k, variable electrical resistance 304, and/or variable electrical inductance 306 may also change in response to the change in distance. These changes in the various electrical parameters may, in turn, modify an effective impedance ZL of inductive coil 202.

Figures 3, 4A:
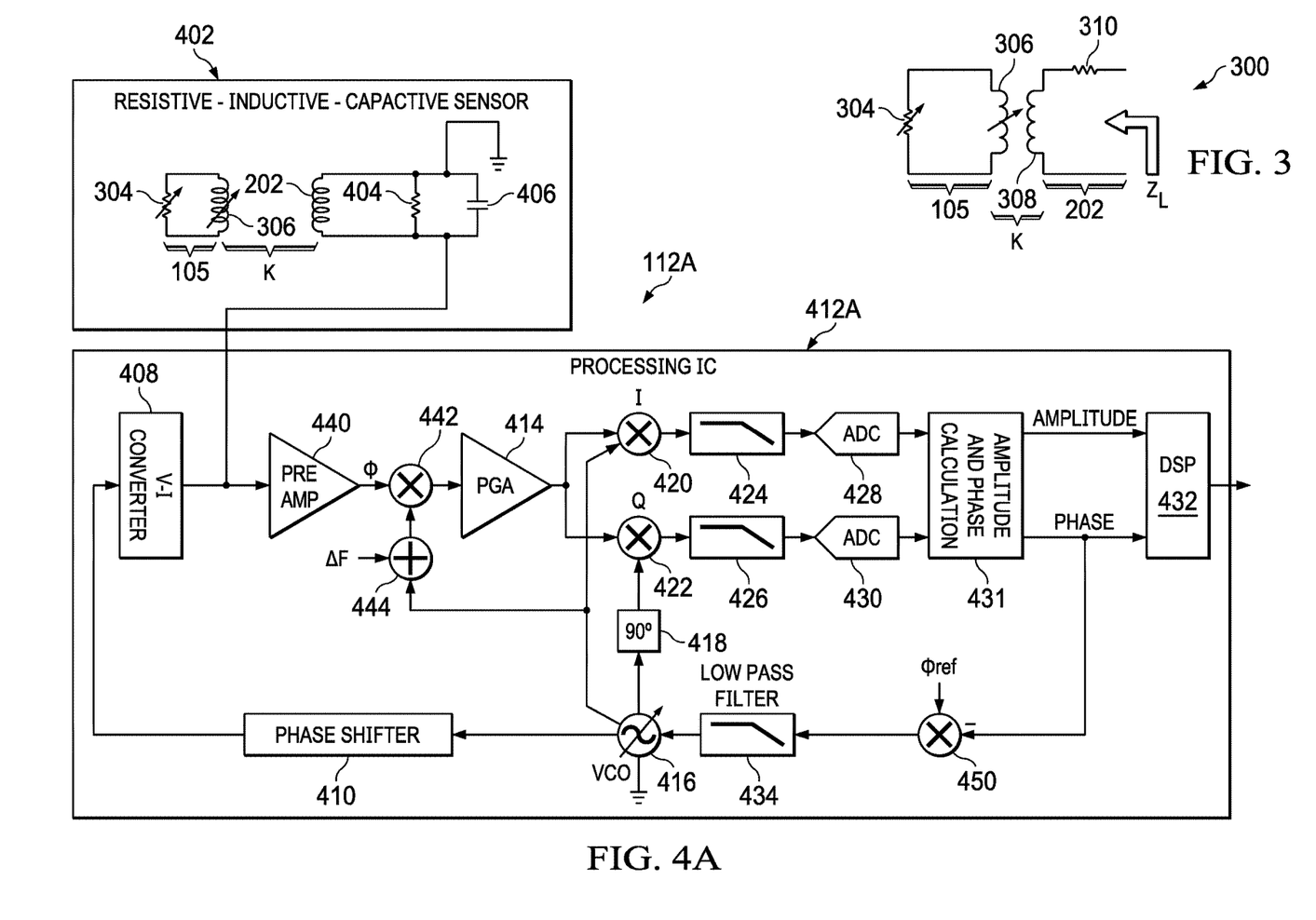

FIG. 4A illustrates a diagram of selected components of an example resonant phase sensing system 112A, in accordance with embodiments of the present disclosure. In some embodiments, resonant phase sensing system 112A may be used to implement resonant phase sensing system 112 of FIG. 1. As shown FIG. 4A, resonant phase sensing system 112A may include a resistive-inductive-capacitive sensor 402 and a processing integrated circuit (IC) 412A.

As shown in FIG. 4A, resistive-inductive-capacitive sensor 402 may include mechanical member 105, inductive coil 202, a resistor 404, and capacitor 406, wherein mechanical member 105 and inductive coil 202 have a variable coupling coefficient k. Although shown in FIG. 4A to be arranged in parallel with one another, it is understood that inductive coil 202, resistor 404, and capacitor 406 may be arranged in any other suitable manner that allows resistive-inductive-capacitive sensor 402 to act as a resonant tank. For example, in some embodiments, inductive coil 202, resistor 404, and capacitor 406 may be arranged in series with one another. In some embodiments, resistor 404 may not be implemented with a stand-alone resistor, but may instead be implemented by a parasitic resistance of inductive coil 202, a parasitic resistance of capacitor 406, and/or any other suitable parasitic resistance.

Processing IC 412A may be communicatively coupled to resistive-inductive-capacitive sensor 402 and may comprise any suitable system, device, or apparatus configured to implement a measurement circuit to measure phase information associated with resistive-inductive-capacitive sensor 402 and based on the phase information, determine a displacement of mechanical member 105 relative to resistive-inductive-capacitive sensor 402. Thus, processing IC 412A may be configured to determine an occurrence of a physical interaction (e.g., press or release of a virtual button) associated with a human-machine interface associated with mechanical member 105 based on the phase information.

As shown in FIG. 4A, processing IC 412A may include a phase shifter 410, a voltage-to-current converter 408, a preamplifier 440, an intermediate frequency mixer 442, a combiner 444, a programmable gain amplifier (PGA) 414, a voltage-controlled oscillator (VCO) 416, a phase shifter 418, an amplitude and phase calculation block 431, a DSP 432, a low-pass filter 434, and a combiner 450. Processing IC 412A may also include a coherent incident/quadrature detector implemented with an incident channel comprising a mixer 420, a low-pass filter 424, and an analog-to-digital converter (ADC) 428, and a quadrature channel comprising a mixer 422, a low-pass filter 426, and an ADC 430 such that processing IC 412A is configured to measure the phase information using the coherent incident/quadrature detector.

Phase shifter 410 may include any system, device, or apparatus configured to detect an oscillation signal generated by processing IC 412A (as explained in greater detail below) and phase shift such oscillation signal (e.g., by 45 degrees) such that a normal operating frequency of resonant phase sensing system 112A, an incident component of a sensor signal ϕ generated by pre-amplifier 440 is approximately equal to a quadrature component of sensor signal ϕ, so as to provide common mode noise rejection by a phase detector implemented by processing IC 412A, as described in greater detail below.

Voltage-to-current converter 408 may receive the phase shifted oscillation signal from phase shifter 410, which may be a voltage signal, convert the voltage signal to a corresponding current signal, and drive the current signal on resistive-inductive-capacitive sensor 402 at a driving frequency with the phase-shifted oscillation signal in order to generate sensor signal φ which may be processed by processing IC 412A, as described in greater detail below. In some embodiments, a driving frequency of the phase-shifted oscillation signal may be selected based on a resonant frequency of resistive-inductive-capacitive sensor 402 (e.g., may be approximately equal to the resonant frequency of resistive-inductive-capacitive sensor 402).

Preamplifier 440 may receive sensor signal φ and condition sensor signal φ for frequency mixing, with mixer 442, sensor signal φ to an intermediate frequency Δf combined by combiner 444 with an oscillation frequency generated by VCO 416, as described in greater detail below, wherein intermediate frequency Δf is significantly less than the oscillation frequency. In some embodiments, preamplifier 440, mixer 442, and combiner 444 may not be present, in which case PGA 414 may receive sensor signal 4 directly from resistive-inductive-capacitive sensor 402. However, when present, preamplifier 440, mixer 442, and combiner 444 may allow for mixing sensor signal 4 down to a lower frequency intermediate frequency Δf which may allow for lower-bandwidth and more efficient ADCs (e.g., ADCs 428 and 430 of FIGS. 4A and 4B, described below) and/or which may allow for minimization of phase and/or gain mismatches in the incident and quadrature paths of the phase detector of processing IC 412A.

In operation, PGA 414 may further amplify sensor signal φ to condition sensor signal φ for processing by the coherent incident/quadrature detector. VCO 416 may generate an oscillation signal to be used as a basis for the signal driven by voltage-to-current converter 408, as well as the oscillation signals used by mixers 420 and 422 to extract incident and quadrature components of amplified sensor signal φ. As shown in FIG. 4A, mixer 420 of the incident channel may use an unshifted version of the oscillation signal generated by VCO 416, while mixer 422 of the quadrature channel may use a 90-degree shifted version of the oscillation signal phase shifted by phase shifter 418. As mentioned above, the oscillation frequency of the oscillation signal generated by VCO 416 may be selected based on a resonant frequency of resistive-inductive-capacitive sensor 402 (e.g., may be approximately equal to the resonant frequency of resistive-inductive-capacitive sensor 402).

In the incident channel, mixer 420 may extract the incident component of amplified sensor signal 4, low-pass filter 424 may filter out the oscillation signal mixed with the amplified sensor signal φ to generate a direct current (DC) incident component, and ADC 428 may convert such DC incident component into an equivalent incident component digital signal for processing by amplitude and phase calculation block 431. Similarly, in the quadrature channel, mixer 422 may extract the quadrature component of amplified sensor signal 4, low-pass filter 426 may filter out the phase-shifted oscillation signal mixed with the amplified sensor signal φ to generate a direct current (DC) quadrature component, and ADC 430 may convert such DC quadrature component into an equivalent quadrature component digital signal for processing by amplitude and phase calculation block 431.

Amplitude and phase calculation block 431 may include any system, device, or apparatus configured to receive phase information comprising the incident component digital signal and the quadrature component digital signal and based thereon, extract amplitude and phase information.

DSP 432 may include any system, device, or apparatus configured to interpret and/or execute program instructions and/or process data. In particular, DSP 432 may receive the phase information and the amplitude information generated by amplitude and phase calculation block 431 and based thereon, determine a displacement of mechanical member 105 relative to resistive-inductive-capacitive sensor 402, which may be indicative of an occurrence of a physical interaction (e.g., press or release of a virtual button) associated with a human-machine interface associated with mechanical member 105 based on the phase information. DSP 432 may also generate an output signal indicative of the displacement. In some embodiments, such output signal may comprise a control signal for controlling mechanical vibration of linear resonant actuator 107 in response to the displacement.

The phase information generated by amplitude and phase calculation block 431 may be subtracted from a reference phase $\phi_{ref}$ by combiner 450 in order to generate an error signal that may be received by low-pass filter 434. Low-pass filter 434 may low-pass filter the error signal, and such filtered error signal may be applied to VCO 416 to modify the frequency of the oscillation signal generated by VCO 416, in order to drive sensor signal φ towards reference phase $\phi_{ref}$. As a result, sensor signal φ may comprise a transient decaying signal in response to a "press" of a virtual button associated with resonant phase sensing system 112A as well as another transient decaying signal in response to a subsequent "release" of the virtual button. Accordingly, low-pass filter 434 in connection with VCO 416 may implement a feedback control loop that may track changes in operating parameters of resonant phase sensing system 112A by modifying the driving frequency of VCO 416.

While example resonant phase sensing system 112A may be capable of sensing phase and a displacement of mechanical member 105, example resonant phase sensing system 112A may not be immune to decreases in measurement accuracy and precision that may be caused by environmental variables (e.g., temperature, humidity) experienced by resistive-inductive-capacitive sensor 402 or decreases in measurement accuracy and precision that may be caused by twisting or torsional events upon all or a part of resistive-inductive-capacitive sensor 402. Accordingly, FIGS. 4B and 4C describe resonant phase sensing systems 112B and 112C that include one or more reference sensors to detect and/or compensate for such effects.

Figure 4B:
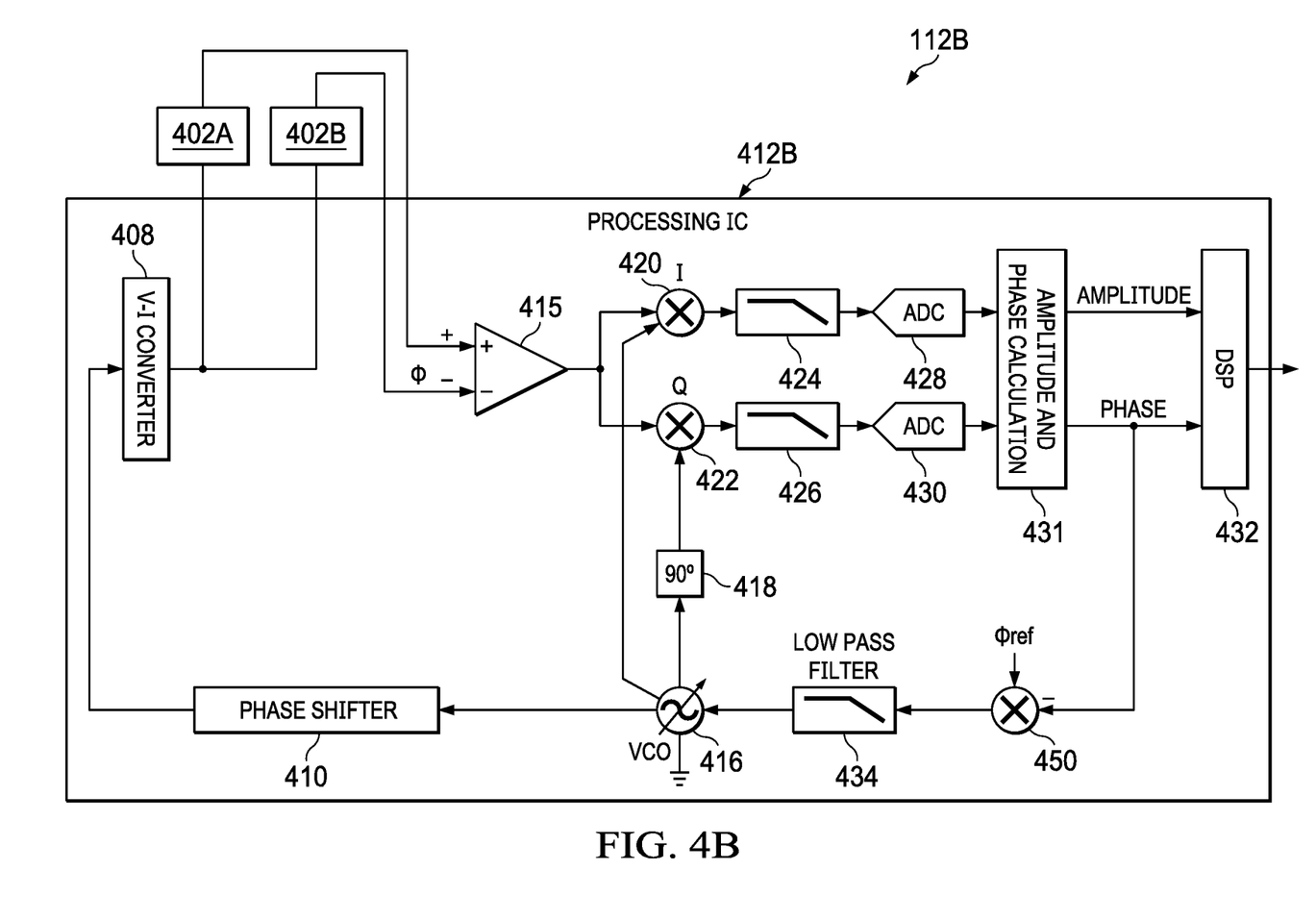

FIG. 4B illustrates a diagram of selected components of an example resonant phase sensing system 112B, in accordance with embodiments of the present disclosure. In some embodiments, resonant phase sensing system 112B may be used to implement resonant phase sensing system 112 of FIG. 1. Resonant phase sensing system 112B of FIG. 4B may be, in many respects, similar to resonant phase sensing system 112A of FIG. 4A. Accordingly, only those differences between resonant phase sensing system 112B and resonant phase sensing system 112A may be described below.

In particular, resonant phase sensing system 112B may include a plurality of resistive-inductive-capacitive sensors 402 (e.g., resistive-inductive-capacitive sensors 402A and 402B) as opposed to the single resistive-inductive-capacitive sensors 402 shown in FIG. 4A. In addition, resonant phase sensing system 112B may include processing IC 412B in lieu of processing IC 412A. Processing IC 412B of FIG. 4B may be, in many respects, similar to processing IC 412A of FIG. 4A. Accordingly, only those differences between processing IC 412B and processing IC 412A may be described below.

A main difference between processing IC 412B and processing IC 412A is that processing IC 412B may include differential amplifier 415 in lieu of programmable gain amplifier 414. Differential amplifier 415 may amplify a differential sensor signal $\phi$ to condition sensor signal $\phi$ for processing by the coherent incident/quadrature detector, wherein the differential inputs to differential amplifier 415 comprise the respective outputs of resistive-inductive-capacitive sensors 402A and 402B.

Accordingly, in operation, one of resistive-inductive-capacitive sensors 402 (e.g., resistive-inductive-capacitive sensor 402B) may be used as a reference sensor to cancel out one or more environmental variables (e.g., temperature, humidity) common to the two or more resistive-inductive-capacitive sensors 402 in order to determine a displacement of a mechanical member 105 relative to another of resistive-inductive-capacitive sensors 402 (e.g., resistive-inductive-capacitive sensor 402A), thus allowing for a more accurate measurement compared to an approach of using a single resistive-inductive-capacitive sensor 402 without a reference sensor. Thus, if two resistive-inductive-capacitive sensors 402 are substantially identical in their physical characteristics, the use of the reference sensor and differential amplifier 414 may cancel out common-mode variances of resistive-inductive-capacitive sensors 402 such that sensor signal $\phi$ excludes such common-mode variances.

For purposes of clarity and exposition, preamplifier 440, mixer 442, and combiner 444 have been excluded from FIG. 4B. However, in some embodiments, processing IC 412B may include preamplifier 440, mixer 442, and combiner 444 similar to that depicted in FIG. 4A.

Figure 4C:
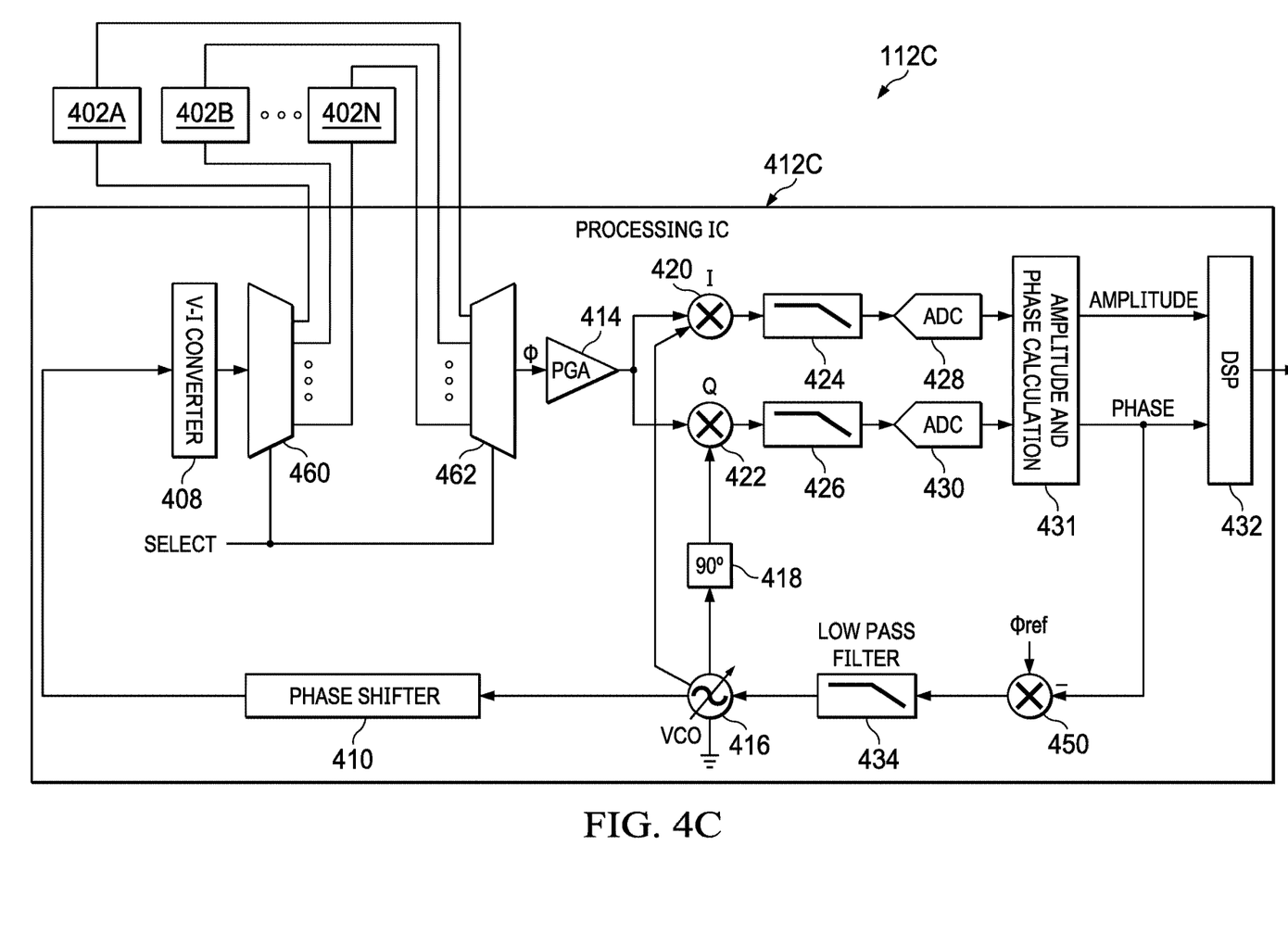

FIG. 4C illustrates a diagram of selected components of an example resonant phase sensing system 112C, in accordance with embodiments of the present disclosure. In some embodiments, resonant phase sensing system 112C may be used to implement resonant phase sensing system 112 of FIG. 1. Resonant phase sensing system 112C of FIG. 4C may be, in many respects, similar to resonant phase sensing system 112B of FIG. 4B. Accordingly, only those differences between resonant phase sensing system 112C and resonant phase sensing system 112B may be described below.

As shown in FIG. 4C, resonant phase sensing system 112C may include processing IC 412C in lieu of processing IC 412B. Processing IC 412C of FIG. 4C may be, in many respects, similar to processing IC 412B of FIG. 4B. Accordingly, only those differences between processing IC 412C and processing IC 412B may be described below.

In particular, resonant phase sensing system 112C may include multiplexers 460 and 462, each of which selects an output signal from a plurality of input signals responsive to a control signal SELECT (which may be controlled by a time-division multiplexing control subsystem implemented by controller 103 or another suitable component of mobile device 102). Thus, in resonant phase sensing system 112C, voltage-to-current converter 408 may drive resistive-inductive-capacitive sensors 402 in a time-division multiplexed manner in accordance with the control provided by multiplexers 460 and 462. Such approach may reduce power consumption and device size as compared with multiple-sensor implementations in which the multiple sensors are simultaneously driven and/or sensed. Device size may be reduced by time-division multiplexing multiple sensors into a single driver and measurement circuit channel, wherein only a single driver and a single measurement circuit may be required, thus minimizing an amount of integrated circuit area needed to perform driving and measurement. In addition, by leveraging a single driver and measurement circuit, no calibration may be needed to adjust for mismatches and/or errors between different drivers and/or different measurement circuits.

In addition, processing IC 412C of FIG. 4C may include programmable gain amplifier (PGA) 414 in lieu of differential amplifier 415. In operation, PGA 414 may amplify sensor signal $\phi$ to condition sensor signal $\phi$ for processing by the coherent incident/quadrature detector.

In resonant phase sensing system 112C, when a first resistive-inductive-capacitive sensor (e.g., resistive-inductive-capacitive sensor 402A) is selected by the time-division multiplexing control subsystem for being driven by voltage-to-current converter 408 and measured by the measurement circuit implemented by processing IC 412C, other resistive-inductive-capacitive sensors (e.g., resistive-inductive-capacitive sensors 402B-402N) may each be placed in a low-impedance state. Similarly, when a second resistive-inductive-capacitive sensor (e.g., resistive-inductive-capacitive sensor 402B) is selected by the time-division multiplexing control subsystem for being driven by voltage-to-current converter 408 and measured by the measurement circuit implemented by processing IC 412C, other resistive-inductive-capacitive sensors (e.g., resistive-inductive-capacitive sensors other than 402B, including 402A) may each be placed in a low-impedance state. Such an approach may minimize power consumption within unselected resistive-inductive-capacitive sensors 402.

Similar to resonant phase sensing system 112B, in operation of resonant phase sensing system 112C, one of resistive-inductive-capacitive sensors 402 (e.g., resistive-inductive-capacitive sensor 402B) may be used as a reference sensor to cancel out one or more environmental variables (e.g., temperature, humidity) common to the two or more resistive-inductive-capacitive sensors 402 in order to determine a displacement of a mechanical member 105 relative to another of resistive-inductive-capacitive sensors 402 (e.g., resistive-inductive-capacitive sensor 402A), thus allowing for a more accurate measurement compared to an approach of using a single resistive-inductive-capacitive sensor 402 without a reference sensor. Thus, if two resistive-inductive-capacitive sensors 402 are substantially identical in their physical characteristics, processing IC 412C may use the reference sensor to cancel out common-mode variances of resistive-inductive-capacitive sensors 402 such that the phase information.

In some embodiments, a resistive-inductive-capacitive sensor 402 employed as a reference sensor may not have a moveable mechanical member 105 and/or virtual button associated with it, such that reference resistive-inductive-capacitive sensor 402 remains as a fixed reference. However, in other embodiments, a resistive-inductive-capacitive sensor 402 employed as a reference sensor may have a moveable mechanical member 105 and/or virtual button associated with it, such that the reference sensor serves as both a reference sensor in some instances and to sense displacement of a mechanical member 105 in other instances. Thus, in such instances, a resonance phase sensing system 112 may determine a first displacement of a first mechanical member 105 relative to a first resistive-inductive-capacitive sensor (e.g., resistive-inductive-capacitive sensor 402A) a measurement of a second displacement indicates an absence of human interaction with a second mechanical member, wherein the second displacement is determined based on second phase information associated with a second resistive-inductive-capacitive sensor (e.g., resistive-inductive-capacitive sensor 402B) associated with the second mechanical member.

In these and other embodiments, a resistive-inductive-capacitive sensor 402 may be employed as a reference sensor for a plurality of other resistive-inductive-capacitive sensors 402. For example, referring to FIG. 4C, one of resistive-inductive-capacitive sensors 402 (e.g., resistive-inductive-capacitive sensor 402A) may be used as a reference sensor to cancel out one or more environmental variables (e.g., temperature, humidity) common to itself and two or more other resistive-inductive-capacitive sensors 402 (e.g., resistive-inductive-capacitive sensors 402B through 402N) in order to determine a displacement of each of a plurality mechanical members 105 relative to respective resistive-inductive-capacitive sensors 402 (e.g., resistive-inductive-capacitive sensors 402B through 402N).

In these and other embodiments, a plurality resistive-inductive-capacitive sensors 402 may be employed as reference sensors for another resistive-inductive-capacitive sensor 402. For example, referring to FIG. 4C, two of resistive-inductive-capacitive sensors 402 (e.g., resistive-inductive-capacitive sensors 402A and 402B) may be used as a reference sensor to cancel out one or more environmental variables (e.g., temperature, humidity) common to such two reference sensors and at least one other resistive-inductive-capacitive sensor 402 (e.g., resistive-inductive-capacitive sensor 402N) in order to determine a displacement of a mechanical member 105 relative the other resistive-inductive-capacitive sensor 402 (e.g., resistive-inductive-capacitive sensor 402N).

The foregoing contemplates the use of measured phase information to determine displacement. However, a sensed amplitude associated with multiple resistive-inductive-capacitive sensors 402 may also be used, in connection with phase information (e.g., phase information associated with a reference sensor and a second sensor) to determine displacement of a mechanical member (e.g., a displacement of a mechanical member associated with the second, non-reference, sensor).

While the foregoing contemplates use of resonant phase sensing to determine a displacement of mechanical members relative to respective sensors, the techniques discussed above, in particular the use of a reference sensor, can be used to determine directionality of displacements of mechanical members relative to respective sensors. Such detection of displacement directionality may be useful to detect twisting or torsional events experienced by a device (e.g., mobile device 102). Such information can thus be used (e.g., by controller 103 and/or DSP 432) to modify thresholds or measurement sensitivity associated with resistive-inductive-capacitive sensors 402 in order to reduce or eliminate false triggering associated with virtual buttons and caused by such twisting or torsional events. In addition or alternatively, such information may be used to impose a blanking period to deactivate a response of the device responsive to resistive-inductive-capacitive sensors 402 and/or virtual buttons associated therewith. Thus, such information may be used such that detection events may be acted upon or ignored in accordance with the information. Accordingly, undesired effects such as device twisting, multiple button presses, and/or other invalid user inputs do not cause undesirable system responses. Such processing in response to relative displacement may be applied in any suitable manner, including to raw sensor information generated by resistive-inductive-capacitive sensors 402 or to binary data used in processing (e.g., threshold levels for sensor deflection). Such processing in response to relative displacement and/or processing undertaken to determine relative displacement may be performed by any suitable component of mobile device 102, including binary logic (e.g., comparators), digital algorithms (e.g., by DSP 432), and/or analog components (e.g., summation amplifiers, difference amplifiers, inverters, etc). In addition or alternatively, such processing in response to relative displacement may include adding gain to a signal processing path of a sensor and/or addition/removal of mismatch between sensors to achieve a desired result.

Figure 5:
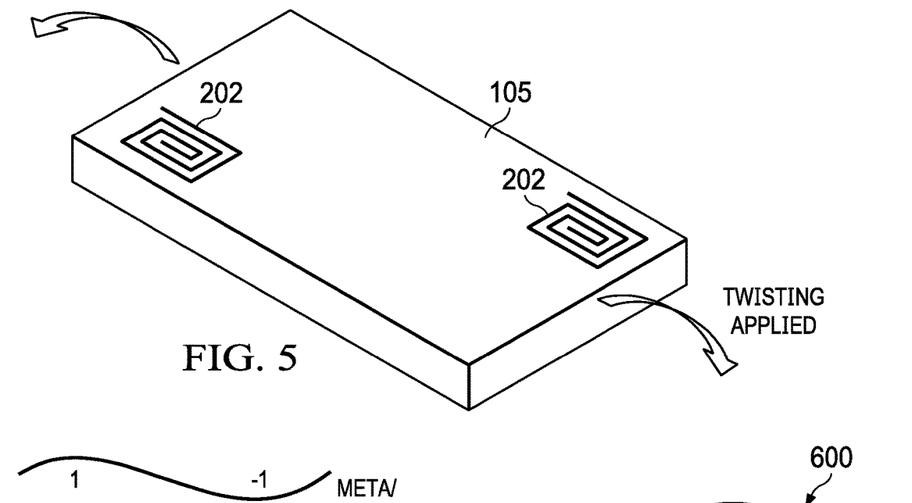
FIG. 5, illustrates a mechanical member which is proximate to two inductive coils, in accordance with embodiments of the present disclosure; and Each of FIGS. 6A-6D illustrates logic to determine whether displacement of a mechanical member proximate to a first inductive coil is in the same direction of displacement of the mechanical member proximate to a second inductive coil, in accordance with embodiments of the present disclosure.

To illustrate, reference is made to FIG. 5, which shows a mechanical member 105 which is proximate to two inductive coils 202. In accordance with the systems and methods described above, each inductive coil 202 shown in FIG. 5 may be placed proximate to a respective resistive-inductive-capacitive sensor 402, and one or more processing ICs (e.g., processing ICs 412A, 412B) may be used to extract phase information associated with each respective resistive-inductive-capacitive sensor 402.

Figure 6A:
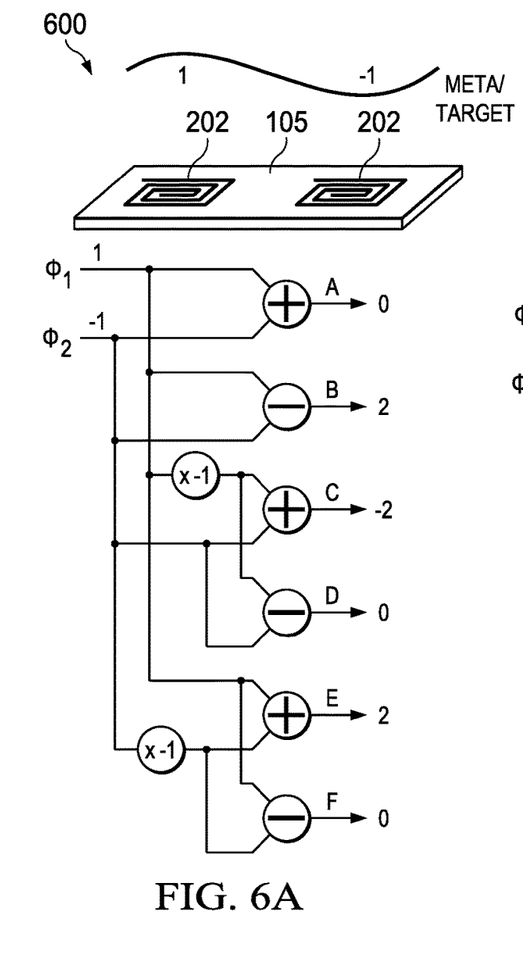
Figure 6B:
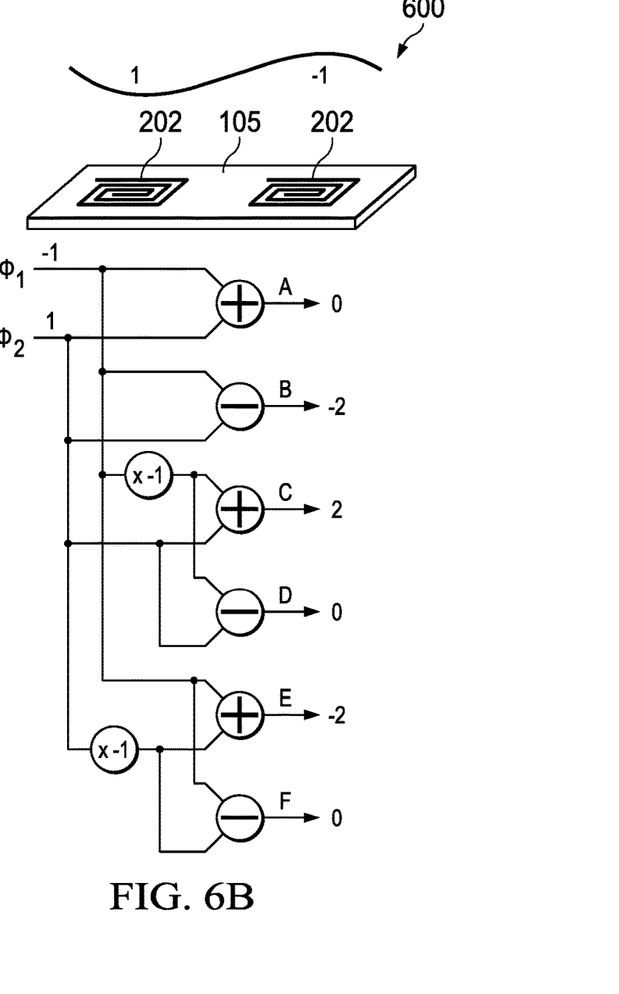
Figure 6C:
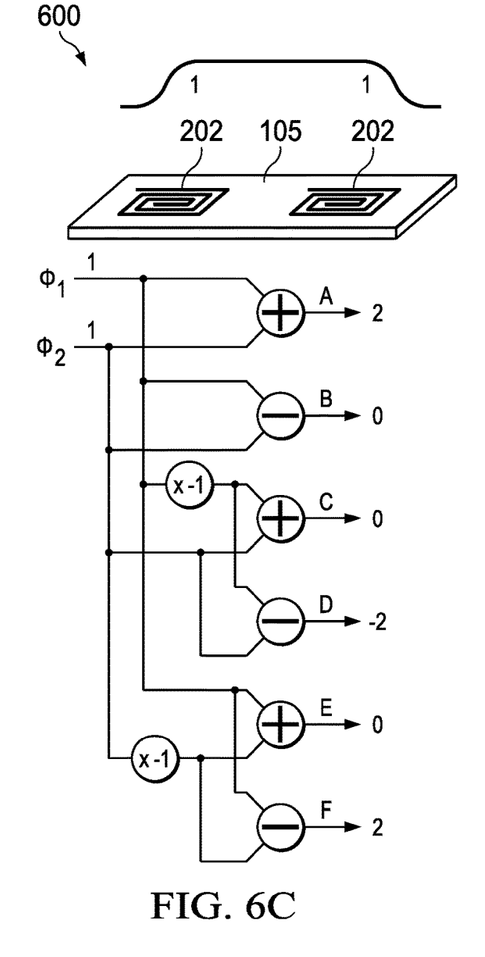
Figure 6D:
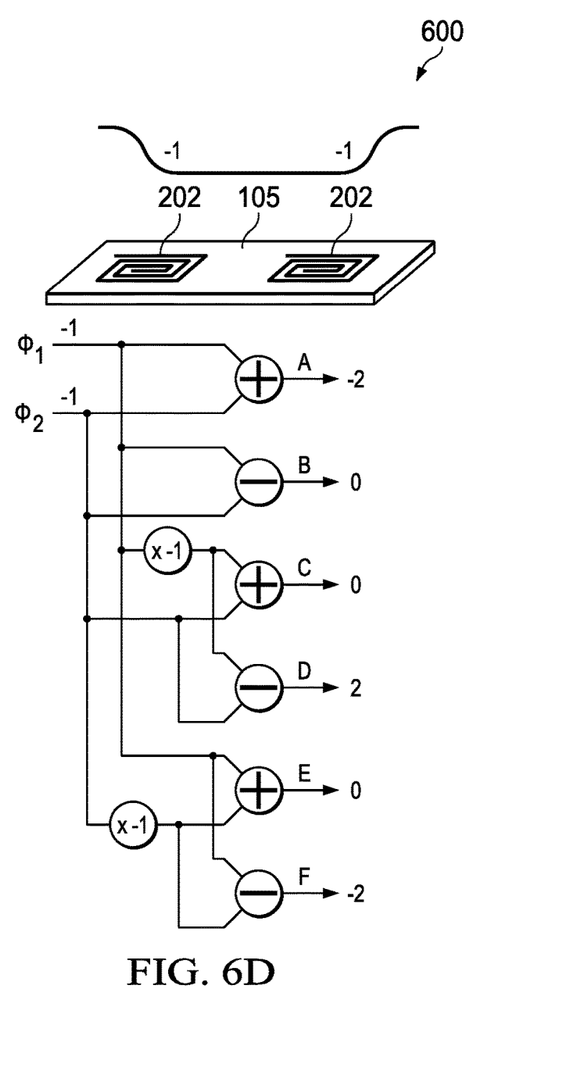

As shown in FIGS. 6A-6D, DSP 432 may implement logic to determine whether displacement of mechanical member 105 proximate to a first inductive coil 202 is in the same direction of displacement of mechanical member 105 proximate to a second inductive coil 202 (e.g., as shown in FIGS. 6A and 6B, thus indicating the presence of twisting or torsional forces) or whether such displacements are in the same direction (e.g., as shown in FIGS. 6C and 6D, thus indicating the absence of twisting or torsional forces).

In FIGS. 6A and 6B, two resistive-inductive-capacitive sensors 402 (not shown in FIGS. 6A and 6B) may respond to opposite metal deflection. The associated phase shifts ($\phi_1$ and $\phi_2$) from each resistive-inductive-capacitive sensor 402 may be processed by a processing block 600 of DSP 432 where displacement of mechanical member 105 may be detected and a directionality of displacement of mechanical member 105 may be determined, wherein 1 and −1 shown in FIGS. 6A and 6B indicate a relative direction of displacement from a nominal resting state of mechanical member 105.

In FIGS. 6C and 6D, two resistive-inductive-capacitive sensors 402 (not shown in FIGS. 6C and 6D) may respond to metal deflection in the same direction. The associated phase shifts ($\phi_1$ and $\phi_2$) from each resistive-inductive-capacitive sensor 402 may be processed by a processing block 600 of DSP 432 where displacement of mechanical member 105 may be detected and a directionality of displacement of mechanical member 105 may be determined, wherein 1 and −1 shown in FIGS. 6C and 6D indicate a relative direction of displacement from a nominal resting state of mechanical member 105.

Although the foregoing contemplates use of closed-loop feedback for sensing of displacement, the various embodiments represented by FIGS. 4A-6 may be modified to implement an open-loop system for sensing of displacement. In such an open-loop system, a processing IC may include no feedback path from amplitude and phase calculation block 431 to VCO 416 or variable phase shifter 419 and thus may also lack a feedback low-pass filter 434. Thus, a phase measurement may still be made by comparing a change in phase to a reference phase value, but the oscillation frequency driven by VCO 416 may not be modified or the phase shifted by variable phase shifter 419 may not be shifted.

Although the foregoing contemplates use of a coherent incident/quadrature detector as a phase detector for determining phase information associated with resistive-inductive-capacitive sensor 402, a resonant phase sensing system 112 may perform phase detection and/or otherwise determine phase information associated with resistive-inductive-capacitive sensor 402 in any suitable manner, including, without limitation, using only one of the incident path or quadrature path to determine phase information.

In some embodiments, an incident/quadrature detector as disclosed herein may include one or more frequency translation stages that translate the sensor signal into direct-current signal directly or into an intermediate frequency signal and then into a direct-current signal. Any of such frequency translation stages may be implemented either digitally after an analog-to-digital converter stage or in analog before an analog-to-digital converter stage.

In addition, although the foregoing contemplates measuring changes in resistance and inductance in resistive-inductive-capacitive sensor 402 caused by displacement of mechanical member 105, other embodiments may operate based on a principle that any change in impedance based on displacement of mechanical member 105 may be used to sense displacement. For example, in some embodiments, displacement of mechanical member 105 may cause a change in a capacitance of resistive-inductive-capacitive sensor 402, such as if mechanical member 105 included a metal plate implementing one of the capacitive plates of capacitor 406.

Although DSP 432 may be capable of processing phase information to make a binary determination of whether physical interaction associated with a human-machine interface associated with mechanical member 105 has occurred and/or ceased to occur, in some embodiments, DSP 432 may quantify a duration of a displacement of mechanical member 105 to more than one detection threshold, for example to detect different types of physical interactions (e.g., a short press of a virtual button versus a long press of the virtual button). In these and other embodiments, DSP 432 may quantify a magnitude of the displacement to more than one detection threshold, for example to detect different types of physical interactions (e.g., a light press of a virtual button versus a quick and hard press of the virtual button).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
   a first resistive-inductive-capacitive sensor;
   a second resistive-inductive-capacitive sensor; and
   a measurement circuit communicatively coupled to the first resistive-inductive-capacitive sensor and the second resistive-inductive-capacitive sensor and configured to:
   measure first phase information associated with the first resistive-inductive-capacitive sensor;
   measure second phase information associated with the second resistive-inductive-capacitive sensor; and
   based on the first phase information and the second phase information, determine a displacement of a mechanical member relative to the first resistive-inductive-capacitive sensor;
   wherein the measurement circuit uses the second phase information to cancel out one or more environmental variables common to the first resistive-inductive-capacitive sensor and the second resistive-inductive-capacitive sensor in order to determine the displacement.

2. The system of claim 1, wherein the one or more environmental variables comprise one or more of temperature and humidity.

3. The system of claim 1, further comprising a third resistive-inductive-capacitive sensor and wherein the measurement circuit is further configured to:

measure third phase information associated with the third resistive-inductive-capacitive sensor; and based on the third phase information and the second phase information, determine a displacement of a second mechanical member relative to the third resistive-inductive-capacitive sensor.

4. The system of claim 1, further comprising a third resistive-inductive-capacitive sensor and wherein the measurement circuit is further configured to:

measure third phase information associated with the third resistive-inductive-capacitive sensor; and based on the first phase information, the second phase information, and the third phase information, determine a displacement of a mechanical member relative to the first resistive-inductive-capacitive sensor.

5. The system of claim 1, wherein the second resistive-inductive-capacitive sensor is placed physically proximate to the first resistive-inductive-capacitive sensor.

6. The system of claim 1, wherein the displacement is indicative of a human interaction with the mechanical member.

7. The system of claim 1, wherein the measurement circuit is further configured to:

measure amplitude information associated with at least one of the first resistive-inductive-capacitive sensor and the second resistive-inductive-capacitive sensor; and based on the amplitude information, the first phase information, and the second phase information, determine the displacement.

8. A system comprising:

a first resistive-inductive-capacitive sensor;

a second resistive-inductive-capacitive sensor; and a measurement circuit communicatively coupled to the first resistive-inductive-capacitive sensor and the second resistive-inductive-capacitive sensor and configured to:

measure first phase information associated with the first resistive-inductive-capacitive sensor;

measure second phase information associated with the second resistive-inductive-capacitive sensor;

based on the first phase information and the second phase information, determine a displacement of a mechanical member relative to the first resistive-inductive-capacitive sensor, wherein the displacement is indicative of a human interaction with the mechanical member;

based at least on the second phase information, determine a second displacement of a second mechanical member relative to the second resistive-inductive-capacitive sensor, wherein the second displacement is indicative of a human interaction with the second mechanical member; and determine the displacement of the mechanical member relative to the first resistive-inductive-capacitive sensor when the second displacement indicates an absence of human interaction with the second mechanical member.

9. The system of claim 8, wherein the measurement circuit uses the second phase information to cancel out one or more environmental variables common to the first resistive-inductive-capacitive sensor and the second resistive-inductive-capacitive sensor in order to determine the displacement.

10. The system of claim 9, wherein the one or more environmental variables comprise one or more of temperature and humidity.

11. The system of claim 8, further comprising a third resistive-inductive-capacitive sensor and wherein the measurement circuit is further configured to:

measure third phase information associated with the third resistive-inductive-capacitive sensor; and based on the third phase information and the second phase information, determine a displacement of a second mechanical member relative to the third resistive-inductive-capacitive sensor.

12. The system of claim 8, further comprising a third resistive-inductive-capacitive sensor and wherein the measurement circuit is further configured to:

measure third phase information associated with the third resistive-inductive-capacitive sensor; and based on the first phase information, the second phase information, and the third phase information, determine a displacement of a mechanical member relative to the first resistive-inductive-capacitive sensor.

13. The system of claim 8, wherein the second resistive-inductive-capacitive sensor is placed physically proximate to the first resistive-inductive-capacitive sensor.

14. The system of claim 8, wherein the measurement circuit is further configured to:

measure amplitude information associated with at least one of the first resistive-inductive-capacitive sensor and the second resistive-inductive-capacitive sensor; and based on the amplitude information, the first phase information, and the second phase information, determine the displacement.

15. A system comprising:

a first resistive-inductive-capacitive sensor;

a second resistive-inductive-capacitive sensor; and a measurement circuit communicatively coupled to the first resistive-inductive-capacitive sensor and the second resistive-inductive-capacitive sensor and configured to:

measure first phase information associated with the first resistive-inductive-capacitive sensor;

measure second phase information associated with the second resistive-inductive-capacitive sensor; and based on the first phase information and the second phase information:

determine a displacement of a mechanical member relative to the first resistive-inductive-capacitive sensor, wherein the displacement is indicative of a human interaction with the mechanical member;

determine a second displacement of a second mechanical member relative to the second resistive-inductive-capacitive sensor; and determine a directionality of the first displacement and the second displacement.

16. The system of claim 15, wherein the directionality indicates a presence or absence of twisting or torsional events on at least one of the first resistive-inductive-capacitive sensor and the second resistive-inductive-capacitive sensor.

17. The system of claim 16, wherein the measurement circuit is configured to modify a detection threshold associated with at least one of the first resistive-inductive-capacitive sensor and the second resistive-inductive-capacitive sensor in order to minimize false triggering associated with virtual buttons and caused by such twisting or torsional events.

18. The system of claim 16, wherein the measurement circuit is configured to modify a measurement sensitivity associated with at least one of the first resistive-inductivecapacitive sensor and the second resistive-inductive-capacitive sensor in order minimize false triggering associated with virtual buttons and caused by such twisting or torsional events.

19. The system of claim 16, wherein the measurement circuit is configured to impose a blanking period to deactivate a response to at least one of the first resistive-inductive-capacitive sensor and the second resistive-inductive-capacitive sensor based on the directionality.

20. The system of claim 15, wherein the measurement circuit uses the second phase information to cancel out one or more environmental variables common to the first resistive-inductive-capacitive sensor and the second resistive-inductive-capacitive sensor in order to determine the displacement.

21. The system of claim 20, wherein the one or more environmental variables comprise one or more of temperature and humidity.

22. The system of claim 15, further comprising a third resistive-inductive-capacitive sensor and wherein the measurement circuit is further configured to:
measure third phase information associated with the third resistive-inductive-capacitive sensor; and
based on the third phase information and the second phase information, determine a displacement of a second mechanical member relative to the third resistive-inductive-capacitive sensor.

23. The system of claim 15, further comprising a third resistive-inductive-capacitive sensor and wherein the measurement circuit is further configured to:
measure third phase information associated with the third resistive-inductive-capacitive sensor; and
based on the first phase information, the second phase information, and the third phase information, determine a displacement of a mechanical member relative to the first resistive-inductive-capacitive sensor.

24. The system of claim 15, wherein the second resistive-inductive-capacitive sensor is placed physically proximate to the first resistive-inductive-capacitive sensor.

25. The system of claim 15, wherein the displacement is indicative of a human interaction with the mechanical member.

26. The system of claim 25, wherein the measurement circuit is further configured to:
based at least on the second phase information, determine a second displacement of a second mechanical member relative to the second resistive-inductive-capacitive sensor, wherein the second displacement is indicative of a human interaction with the second mechanical member; and
determine the displacement of the mechanical member relative to the first resistive-inductive-capacitive sensor when the second displacement indicates an absence of human interaction with the second mechanical member.

27. The system of claim 15, wherein the measurement circuit is further configured to:
measure amplitude information associated with at least one of the first resistive-inductive-capacitive sensor and the second resistive-inductive-capacitive sensor; and
based on the amplitude information, the first phase information, and the second phase information, determine the displacement.

28. A method comprising:
measuring first phase information associated with a first resistive-inductive-capacitive sensor;
measuring second phase information associated with a second resistive-inductive-capacitive sensor; and
based on the first phase information and the second phase information, determining a displacement of a mechanical member relative to the first resistive-inductive-capacitive sensor, wherein determining the displacement comprises using the second phase information to cancel out one or more environmental variables common to the first resistive-inductive-capacitive sensor and the second resistive-inductive-capacitive sensor.

29. The method of claim 28, wherein the one or more environmental variables comprise one or more of temperature and humidity.

30. The method of claim 28, further comprising:
measuring third phase information associated with a third resistive-inductive-capacitive sensor; and
based on the third phase information and the second phase information, determining a displacement of a second mechanical member relative to the third resistive-inductive-capacitive sensor.

31. The method of claim 28, further comprising:
measuring third phase information associated with a third resistive-inductive-capacitive sensor; and
based on the first phase information, the second phase information, and the third phase information, determining a displacement of a mechanical member relative to the first resistive-inductive-capacitive sensor.

32. The method of claim 28, wherein the second resistive-inductive-capacitive sensor is placed physically proximate to the first resistive-inductive-capacitive sensor.

33. The method of claim 28, wherein the displacement is indicative of a human interaction with the mechanical member.

34. The method of claim 28, further comprising:
measuring amplitude information associated with at least one of the first resistive-inductive-capacitive sensor and the second resistive-inductive-capacitive sensor; and
based on the amplitude information, the first phase information, and the second phase information, determining the displacement.

35. A method comprising:
measuring first phase information associated with a first resistive-inductive-capacitive sensor;
measuring second phase information associated with a second resistive-inductive-capacitive sensor; and
based on the first phase information and the second phase information, determining a displacement of a mechanical member relative to the first resistive-inductive-capacitive sensor wherein the displacement is indicative of a human interaction with the mechanical member;
based at least on the second phase information, determining a second displacement of a second mechanical member relative to the second resistive-inductive-capacitive sensor, wherein the second displacement is indicative of a human interaction with the second mechanical member; and
determining the displacement of the mechanical member relative to the first resistive-inductive-capacitive sensor when the second displacement indicates an absence of human interaction with the second mechanical member.

36. The method of claim 35, wherein determining the displacement comprises using the second phase information to cancel out one or more environmental variables common to the first resistive-inductive-capacitive sensor and the second resistive-inductive-capacitive sensor.

37. The method of claim 36, wherein the one or more environmental variables comprise one or more of temperature and humidity.

38. The method of claim 35, further comprising:
measuring third phase information associated with a third resistive-inductive-capacitive sensor; and
based on the third phase information and the second phase information, determining a displacement of a second mechanical member relative to the third resistive-inductive-capacitive sensor.

39. The method of claim 35, further comprising:
measuring third phase information associated with a third resistive-inductive-capacitive sensor; and
based on the first phase information, the second phase information, and the third phase information, determining a displacement of a mechanical member relative to the first resistive-inductive-capacitive sensor.

40. The method of claim 35, wherein the second resistive-inductive-capacitive sensor is placed physically proximate to the first resistive-inductive-capacitive sensor.

41. The method of claim 35, further comprising:
measuring amplitude information associated with at least one of the first resistive-inductive-capacitive sensor and the second resistive-inductive-capacitive sensor; and
based on the amplitude information, the first phase information, and the second phase information, determining the displacement.

42. A method comprising:
measuring first phase information associated with a first resistive-inductive-capacitive sensor;
measuring second phase information associated with a second resistive-inductive-capacitive sensor; and
based on the first phase information and the second phase information:
determining a displacement of a mechanical member relative to the first resistive-inductive-capacitive sensor wherein the displacement is indicative of a human interaction with the mechanical member;
determining a second displacement of a second mechanical member relative to the second resistive-inductive-capacitive sensor; and
determining a directionality of the first displacement and the second displacement.

43. The method of claim 42, wherein the directionality indicates a presence or absence of twisting or torsional events on at least one of the first resistive-inductive-capacitive sensor and the second resistive-inductive-capacitive sensor.

44. The method of claim 43, further comprising modifying a detection threshold associated with at least one of the first resistive-inductive-capacitive sensor and the second resistive-inductive-capacitive sensor in order to minimize false triggering associated with virtual buttons and caused by such twisting or torsional events.

45. The method of claim 43, further comprising modifying a measurement sensitivity associated with at least one of the first resistive-inductive-capacitive sensor and the second resistive-inductive-capacitive sensor in order minimize false triggering associated with virtual buttons and caused by such twisting or torsional events.

46. The method of claim 43, further comprising imposing a blanking period to deactivate a response to at least one of the first resistive-inductive-capacitive sensor and the second resistive-inductive-capacitive sensor based on the directionality.

47. The method of claim 42, wherein determining the displacement comprises using the second phase information to cancel out one or more environmental variables common to the first resistive-inductive-capacitive sensor and the second resistive-inductive-capacitive sensor.

48. The method of claim 47, wherein the one or more environmental variables comprise one or more of temperature and humidity.

49. The method of claim 42, further comprising:
measuring third phase information associated with a third resistive-inductive-capacitive sensor; and
based on the third phase information and the second phase information, determining a displacement of a second mechanical member relative to the third resistive-inductive-capacitive sensor.

50. The method of claim 42, further comprising:
measuring third phase information associated with a third resistive-inductive-capacitive sensor; and
based on the first phase information, the second phase information, and the third phase information, determining a displacement of a mechanical member relative to the first resistive-inductive-capacitive sensor.

51. The method of claim 42, wherein the second resistive-inductive-capacitive sensor is placed physically proximate to the first resistive-inductive-capacitive sensor.

52. The method of claim 42, wherein the displacement is indicative of a human interaction with the mechanical member.

53. The method of claim 52, further comprising:
based at least on the second phase information, determining a second displacement of a second mechanical member relative to the second resistive-inductive-capacitive sensor, wherein the second displacement is indicative of a human interaction with the second mechanical member; and
determining the displacement of the mechanical member relative to the first resistive-inductive-capacitive sensor when the second displacement indicates an absence of human interaction with the second mechanical member.

54. The method of claim 42, further comprising:
measuring amplitude information associated with at least one of the first resistive-inductive-capacitive sensor and the second resistive-inductive-capacitive sensor; and
based on the amplitude information, the first phase information, and the second phase information, determining the displacement.

\* \* \* \* \*

UNITED STATES PATENT AND TRADEMARK OFFICE
CERTIFICATE OF CORRECTION

PATENT NO. : 10,921,159 B1
APPLICATION NO. : 16/299565
DATED : February 16, 2021
INVENTOR(S) : Das et al.

Page 1 of 1

It is certified that error appears in the above-identified patent and that said Letters Patent is hereby corrected as shown below:

In the Specification

1. In Column 3, Lines 51-52, delete "microelectromechanical systems (MEMs)" and insert -- microelectromechanical systems (MEMS) --, therefor.

2. In Column 6, Line 8, delete "ZL" and insert -- $Z_L$ --, therefor.

3. In Column 6, Line 66, delete "pre-amplifier 440" and insert -- preamplifier 440 --, therefor.

4. In Column 7, Line 25, delete "4" and insert -- ϕ --, therefor.

5. In Column 7, Line 28, delete "4" and insert -- ϕ --, therefor.

6. In Column 7, Line 53, delete "4," and insert -- ϕ, --, therefor.

7. In Column 7, Line 61, delete "4," and insert -- ϕ, --, therefor.

8. In Column 9, Lines 29-30, delete "differential amplifier 414" and insert -- differential amplifier 415 --, therefor.

9. In Column 11, Line 21, delete "plurality" and insert -- plurality of --, therefor.

In the Claims

10. In Column 17, Line 2, in Claim 18, delete "order" and insert -- order to --, therefor.

11. In Column 18, Line 46, in Claim 35, delete "sensor; and" and insert -- sensor; --, therefor.

12. In Column 20, Line 2, in Claim 45, delete "order" and insert -- order to --, therefor.

Signed and Sealed this
Eighth Day of November, 2022

Katherine Kelly Vidal
*Director of the United States Patent and Trademark Office*